United States Patent
Won et al.

(10) Patent No.: US 8,994,453 B2
(45) Date of Patent: Mar. 31, 2015

(54) POWER AMPLIFIER

(71) Applicant: Samsung Electro-Mechanics Co., Ltd., Suwon, Gyunggi-do (KR)

(72) Inventors: Jun Goo Won, Gyunggi-do (KR); Youn Suk Kim, Gyunggi-do (KR); Young Jean Song, Gyunggi-do (KR); Ki Joong Kim, Gyunggi-do (KR); Myeong Woo Han, Gyunggi-do (KR); Shinichi Iizuka, Gyunggi-do (KR); Ju Young Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 77 days.

(21) Appl. No.: 13/764,080

(22) Filed: Feb. 11, 2013

(65) Prior Publication Data

US 2014/0139291 A1    May 22, 2014

(30) Foreign Application Priority Data

Nov. 19, 2012   (KR) .................. 10-2012-0131207

(51) Int. Cl.
    H03F 3/21    (2006.01)
    H03F 1/32    (2006.01)
    H03F 3/19    (2006.01)

(52) U.S. Cl.
    CPC .. *H03F 1/32* (2013.01); *H03F 3/21* (2013.01); *H03F 3/19* (2013.01); *H03F 2200/18* (2013.01); *H03F 2200/27* (2013.01)
    USPC ........................................................ 330/289

(58) Field of Classification Search
    USPC ................... 330/285, 296, 289, 136
    See application file for complete search history.

(56) References Cited

U.S. PATENT DOCUMENTS

| 2007/0236293 A1 | 10/2007 | Masuda et al. |
| 2009/0212863 A1 | 8/2009 | Ishimaru |
| 2013/0127540 A1* | 5/2013 | Kim et al. ............ 330/285 |

FOREIGN PATENT DOCUMENTS

| JP | 2007-306543 A | 11/2007 |
| JP | 2009-200770 A | 9/2009 |

* cited by examiner

*Primary Examiner* — Hieu Nguyen
(74) *Attorney, Agent, or Firm* — McDermott Will & Emery LLP

(57) ABSTRACT

There is provided a power amplifier including a bias circuit unit generating a bias voltage of an amplifying unit, a voltage drop unit disposed between the bias circuit unit and the amplifying unit to drop the bias voltage to a base voltage, and a bypass circuit unit including an impedance element connected to the voltage drop unit in parallel and performing a switching operation according to a magnitude of an input signal.

17 Claims, 5 Drawing Sheets

LARGE SIGNAL MODE (Q31: ON)

SMALL SIGNAL MODE (Q31: OFF)

POWER AMPLIFIER

CROSS-REFERENCE TO RELATED APPLICATIONS

This application claims the priority of Korean Patent Application No. 10-2012-0131207 filed on Nov. 19, 2012, in the Korean Intellectual Property Office, the disclosure of which is incorporated herein by reference.

BACKGROUND OF THE INVENTION

1. Field of the Invention

The present invention relates to a power amplifier applicable to a wireless communications system having improved linearity and degradation characteristics.

2. Description of the Related Art

In general, a wireless communications scheme is a digital modulation and demodulation scheme, and an appropriate scheme is employed in terms of the improvement of frequency usage efficiency. For example, a portable phone based on a code division multiple access (CDMA) scheme employs a quadrature phase shift keying (QPSK) scheme, and a wireless local area network (WLAN) following communications standard 802.11 set by the institute of electrical and electronics engineers (IEEE) employs a digital modulation scheme of orthogonal frequency division multiplexing (OFDM).

A wireless communications system employing a wireless communications scheme includes a power amplifier to amplify power of a transmission signal.

Here, a system requiring linear amplification requires a power amplifier having linearity to amplify a transmission signal without distortion. Here, linearity refers to characteristics in which power of an output signal is amplified at a uniform rate and a phase thereof is not changed even in the case that power of an input signal is changed.

An existing power amplifier provides a bias voltage generated in a bias circuit to a power amplifying element through resistance. Here, the bias circuit may include a temperature compensation function.

However, in the existing power amplifier, when a large signal is input, error vector magnitude (EVM) characteristics are not problematic but linearity thereof may be degraded, while when a small signal is input, EVM characteristics may be degraded.

The Related Art Document below relates to a power amplifier, which, however, does not disclose technical matters for improving linearity and characteristics degradation by discriminating between a large input signal and a small input signal.

RELATED ART DOCUMENT

Japanese Patent Laid-Open Publication No. 2009-200770A

SUMMARY OF THE INVENTION

An aspect of the present invention provides a power amplifier which is applicable to a wireless communications system and operates differently based on a large signal and a small signal, based on a pre-set reference value to thus improve linearity and characteristics degradation.

According to an aspect of the present invention, there is provided a power amplifier including: a bias circuit unit generating a bias voltage of an amplifying unit; a voltage drop unit disposed between the bias circuit unit and the amplifying unit to drop the bias voltage to a base voltage; and a bypass circuit unit including an impedance element connected to the voltage drop unit in parallel and performing a switching operation according to a magnitude of an input signal.

When the input signal is equal to or higher than a pre-set reference value, the bypass circuit unit may be switched on, and when the input signal is lower than the pre-set reference value, the bypass circuit unit may be switched off.

The voltage drop unit may include a resistor having one end connected to a supply node of the bias voltage supplied by the bias circuit unit and the other end connected to an input node of the amplifying unit.

The bypass circuit unit may include: a capacitor having one end connected to the supply node of the bias voltage supplied by the bias circuit unit and the other end; and a semiconductor switching device having one end connected to the other end of the capacitor and the other end connected to the input node of the amplifying unit through a signal coupling capacitor, and performing a switching operation according to the magnitude of the input signal.

The semiconductor switching device may perform a switching operation according to a mode voltage having a switching ON level or a switching OFF level according to the magnitude of the input signal.

The bias circuit unit may include: a regulated voltage generation unit generating a regulated voltage by using a pre-set reference voltage; and a bias voltage generation unit generating the bias voltage according to the regulated voltage.

The regulated voltage generation unit may generate the regulated voltage by dividing the reference voltage and performing temperature compensation.

The regulated voltage generation unit may include: a first temperature compensating transistor having a collector connected to a supply terminal of a pre-set reference voltage through a first resistor, an emitter connected to a ground, and a base; and a second temperature compensating transistor having a collector connected to the supply terminal of the reference voltage, a base connected to the collector of the first temperature compensating transistor, and an emitter connected to the ground through a second resistor.

The bias voltage generation unit may include a bias supplying transistor having a collector connected to the supply terminal of the reference voltage, a base connected to the collector of the first temperature compensating transistor, and an emitter connected to the supply node of the bias voltage supplied by the bias circuit unit.

According to another aspect of the present invention, there is provided a power amplifier including: a bias circuit unit generating a bias voltage of an amplifying unit; a voltage drop unit disposed between the bias circuit unit and the amplifying unit to drop the bias voltage to a base voltage; a bypass circuit unit including an impedance element connected to the voltage drop unit in parallel and performing a switching operation according to controlling based on a magnitude of an input signal; and a bypass control unit controlling a switching operation of the bypass circuit unit according to the magnitude of the input signal.

When the input signal is equal to or higher than a pre-set reference value, the bypass control unit may control the bypass circuit unit to be switched on, and when the input signal is lower than the pre-set reference value, the bypass control unit may control the bypass circuit unit to be switched off.

When the input signal is equal to or higher than a pre-set reference value, the bypass circuit unit may be switched on, and when the input signal is lower than the pre-set reference value, the bypass circuit unit may be switched off, under the control of the bypass control unit.

The voltage drop unit may include a resistor having one end connected to a supply node of the bias voltage supplied by the bias circuit unit and the other end connected to an input node of the amplifying unit.

The bypass circuit unit may include: a capacitor having one end connected to the supply node of the bias voltage supplied by the bias circuit unit and the other end; and a semiconductor switching device having one end connected to the other end of the capacitor and the other end connected to the input node of the amplifying unit through a signal coupling capacitor, and performing a switching operation according to a magnitude of the input signal.

When the input signal is equal to or higher than the pre-set reference value, the bypass control unit may provide a mode voltage having a switching ON level to the semiconductor switching device, and when the input signal is lower than the pre-set reference value, the bypass control unit may provide a mode voltage having a switching OFF level to the semiconductor switching device.

The bias circuit unit may include: a regulated voltage generation unit generating a regulated voltage by using a pre-set reference voltage; and a bias voltage generation unit generating a bias voltage according to the regulated voltage.

The regulated voltage generation unit may generate the regulated voltage by dividing the reference voltage and performing temperature compensation.

The regulated voltage generation unit may include: a first temperature compensating transistor having a collector connected to a supply terminal of a pre-set reference voltage through a first resistor, an emitter connected to a ground, and a base; and a second temperature compensating transistor having a collector connected to the supply terminal of the reference voltage, a base connected to the collector of the first temperature compensating transistor, and an emitter connected to the ground through a second resistor.

The bias voltage generation unit may include a bias supplying transistor having a collector connected to the supply terminal of the reference voltage, a base connected to the collector of the first temperature compensating transistor, and an emitter connected to the supply node of the bias voltage supplied by the bias circuit unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
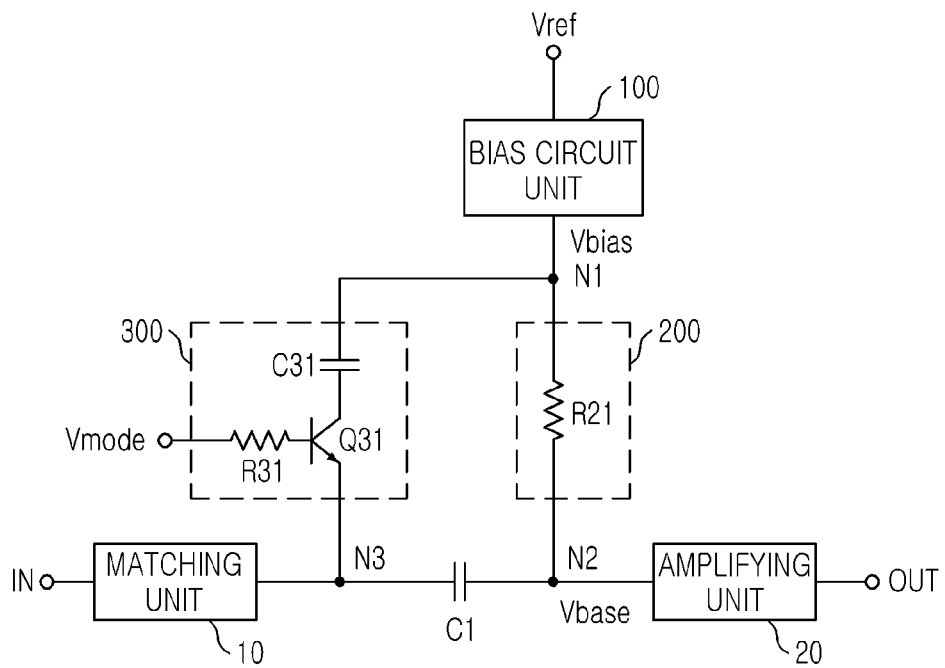
FIG. 1 is a circuit diagram of a power amplifier according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

FIG. 1 is a circuit diagram of a power amplifier according to an embodiment of the present invention.

Referring to FIG. 1, a power amplifier according to an embodiment of the present invention may include a bias circuit unit 100, a voltage drop unit 200, and a bypass circuit unit 300

Figure 2:
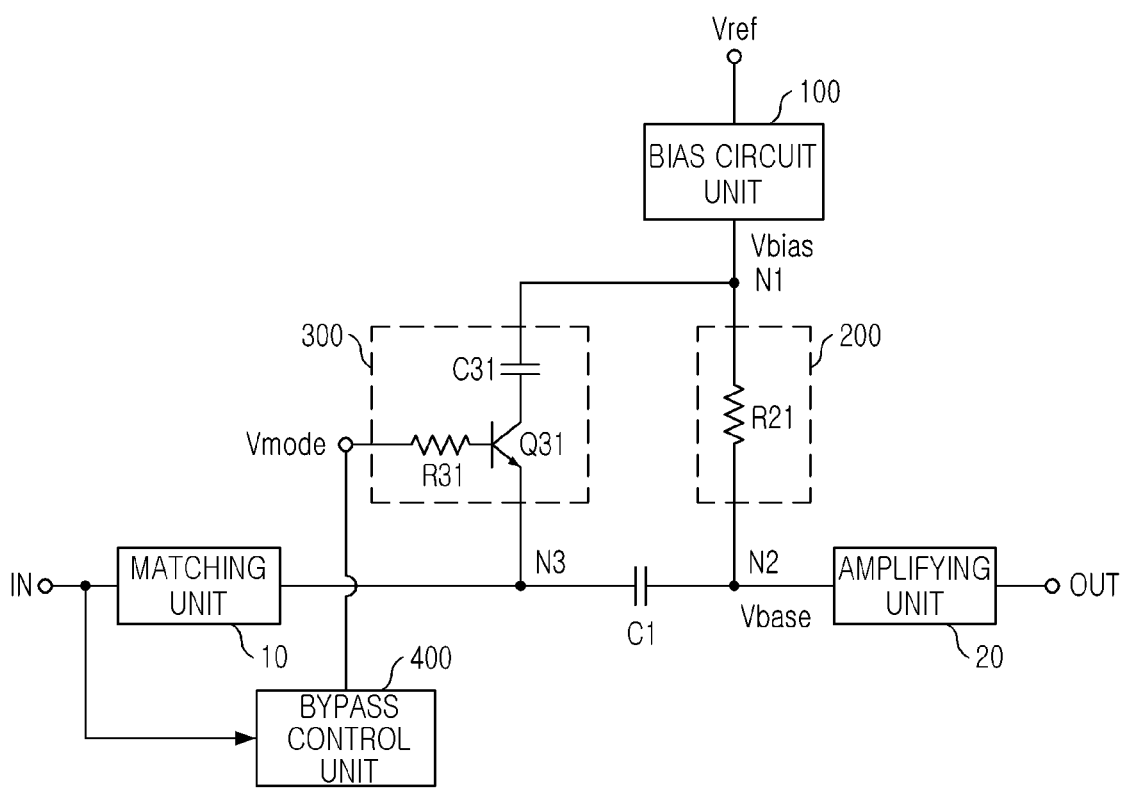
FIG. 2 is a circuit diagram of a power amplifier according to another embodiment of the present invention.

FIG. 2 is a circuit diagram of a power amplifier according to another embodiment of the present invention.

Referring to FIG. 2, a power amplifier according to another embodiment of the present invention may include the bias circuit unit 100, the voltage drop unit 200, the bypass circuit unit 300, and a bypass control unit 400.

Referring to FIGS. 1 and 2, the bias circuit unit 100 may receive a pre-set reference voltage Vref, and generate a bias voltage Vbias for an amplifying unit 20. The amplifying unit 20 may include a power amplifying circuit amplifying power of an input signal through an input terminal IN and providing the power-amplified signal through an output terminal OUT.

The power amplifier according to the embodiment of the present invention may further include a matching unit 10 connected between the input terminal IN and a signal coupling capacitor C1. The matching unit 10 may include an impedance element such as a capacitor and an inductor for impedance matching.

The voltage drop unit 200 may be formed between the bias circuit unit 100 and the amplifying unit 20 to drop the bias voltage Vbias to a base voltage Vbase.

For example, the voltage drop unit 200 may include a resistor R21 having one end connected to a supply node N1 of the bias voltage Vbias supplied by the bias circuit unit 100 and the other end connected to an input node N2 of the amplifying unit 20.

Here, the resistor R21 may drop the bias voltage Vbias by a current flowing in the resistor R21 and a voltage determined by a resistance value of the resistor R21. Since the base voltage Vbase, lower than the bias voltage Vbias due to the presence of the resistor R21, is provided to the amplifying unit 20, a situation in which a thermal runaway phenomenon such as heating the amplifying unit 20 due to the bias voltage increased by heat is repeated may be relatively somewhat restrained.

Also, the bypass circuit unit 300 may include an impedance element connected to the voltage drop unit 200 in parallel, and perform a switching operation according to a magnitude of the input signal.

When the input signal is equal to or higher than a pre-set reference value, the bypass circuit unit 300 may be switched on, and when the input signal is lower than a pre-set reference value, the bypass circuit unit 300 may be switched off.

The bypass circuit unit 300 may include a capacitor C31 having one end connected to the supply node N1 of the bias voltage Vbias supplied by the bias circuit unit 100 and the other end, and a semiconductor switching device Q31 having one end connected to the other end of the capacitor C31 and the other end connected to the input node N2 of the amplifying unit 20 through a signal coupling capacitor C1, and performing a switching operation according to a magnitude of the input signal.

In an implementation example, the semiconductor switching device Q31 may be configured as a transistor (e.g., a bipolar junction transistor (BJT)) having a collector connected to the other end of the capacitor C31, a base connected to the mode voltage Vmode terminal through a resistor R31, and an emitter connected to a connection node N3 between the matching unit 10 and the signal coupling capacitor C1.

Meanwhile, the power amplifier according to the embodiment of the present invention may further include a bypass control unit 400 as illustrated in FIG. 2.

The bypass control unit 400 may control a switching operation of the bypass circuit unit 300 according to a magnitude of the input signal.

In detail, when the input signal is equal to or higher than a pre-set reference value, the bypass control unit 400 may control the bypass circuit unit 300 to be switched on, and when the input signal is lower than the pre-set reference value, the bypass control unit 400 may control the bypass circuit unit to be switched off.

For example, when the input signal is equal to or higher than the pre-set reference value, the bypass control unit 400 may provide a mode voltage Vmode having a switching ON level to the semiconductor switching device Q31, and when the input signal is lower than the pre-set reference value, the bypass control unit 400 may provide a mode voltage Vmode having a switching OFF level to the semiconductor switching device Q31.

The semiconductor switching device Q31 may perform a switching operation according to the mode voltage Vmode having the switching ON level or the switching OFF level according to a magnitude of the input signal.

Figure 3:
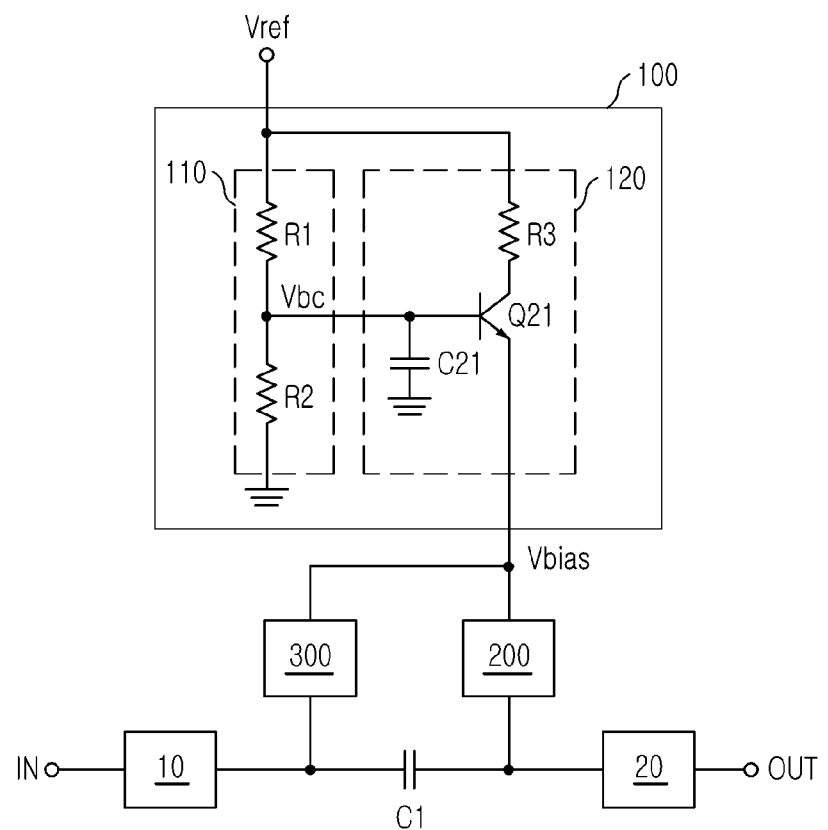
FIG. 3 is a view illustrating a first implementation of a bias circuit unit according to an embodiment of the present invention.
Figure 4:
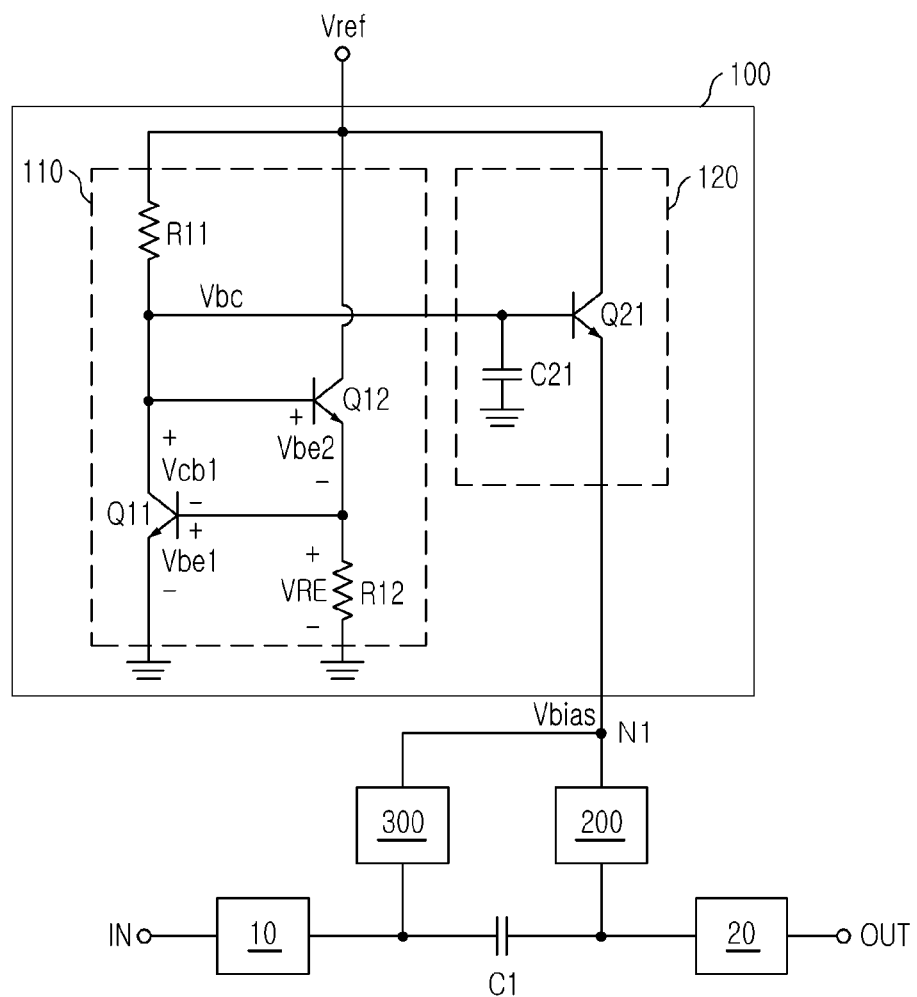
FIG. 4 is a view illustrating a second implementation of the bias circuit unit according to the embodiment of the present invention.

FIG. 3 is a view illustrating a first implementation of a bias circuit unit according to an embodiment of the present invention, and FIG. 4 is a view illustrating a second implementation of the bias circuit unit according to the embodiment of the present invention.

Referring to FIGS. 3 and 4, the bias circuit unit 100 may include a regulated voltage generation unit 110 and a bias voltage generation unit 120.

The regulated voltage generation unit 110 may generate a regulated voltage Vbc by using a pre-set reference voltage Vref.

The bias voltage generation unit 120 may generate the bias voltage Vbias according to the regulated voltage Vbc.

In an implementation example, the regulated voltage generation unit 110 may include two resistors R1 and R2 connected between a supply terminal of the reference voltage Vref and a ground in series. The bias voltage Vbias may be provided from a connection node of the two resistors R1 and R2.

Also, the bias voltage generation unit 120 may include a bias supplying transistor Q21 having a collector connected to the supply terminal of the reference voltage Vref, a base connected to the collector of the first temperature compensating transistor Q11, and an emitter connected to the supply node N1 of the bias voltage Vbias supplied by the bias circuit unit 100.

Here, the bias supplying transistor Q21 allows a current in proportion to a magnitude of the bias voltage Vbias to flow between the collector and the emitter of the bias supplying transistor Q21. This current flows to the voltage drop unit 200, and a voltage thereof is dropped by the voltage drop unit 200.

Referring to FIG. 4, the regulated voltage generation unit 110 may generate the regulated voltage Vbc by dividing the reference voltage Vref and performing temperature compensation.

To this end, the regulated voltage generation unit 110 may include a first temperature compensating transistor Q11 having a collector connected to the supply terminal of the pre-set reference voltage Vref through a first resistor R11, an emitter connected to a ground, and a base, and a second temperature compensating transistor Q12 having a collector connected to the supply terminal of the reference voltage Vref, a base connected to the collector of the first temperature compensating transistor Q11, and an emitter connected to a ground through a second resistor R12.

Here, the base-emitter voltage Vbe1 of the first temperature compensating transistor Q11 is equal to a both end voltage VRE of the second resistor R12, and a collector-base voltage Vcb1 of the first temperature compensating transistor Q11 is equal to a base-emitter voltage Vbe2 of the second temperature compensating transistor Q12.

Thus, the bias voltage Vbias is provided from the collector of the first temperature compensating transistor Q11.

Also, the bias voltage generation unit 120 may include a bias supplying transistor Q21 having a collector connected to the supply terminal of the reference voltage Vref, a base connected to the collector of the first temperature compensating transistor Q11, and an emitter connected to the supply node N1 of the bias voltage supplied by the bias circuit unit 100.

Here, the bias supplying transistor Q21 allows a current in proportion to a magnitude of the bias voltage Vbias to flow between the collector and the emitter of the bias supplying transistor Q21. This current flows to the voltage drop unit 200, and a voltage thereof is dropped by the voltage drop unit 200.

Figure 5:
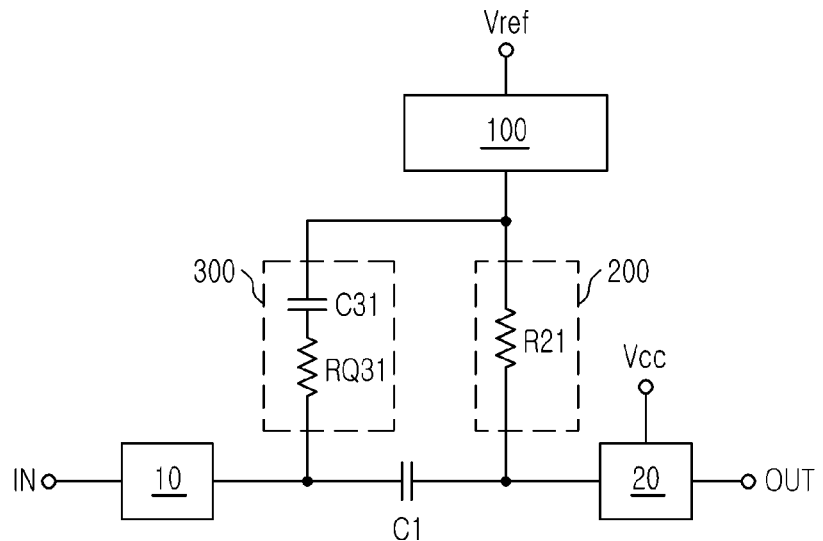
FIG. 5 is an equivalent circuit diagram in which a bypass circuit unit is in an ON state according to an embodiment of the present invention.
Figure 6:
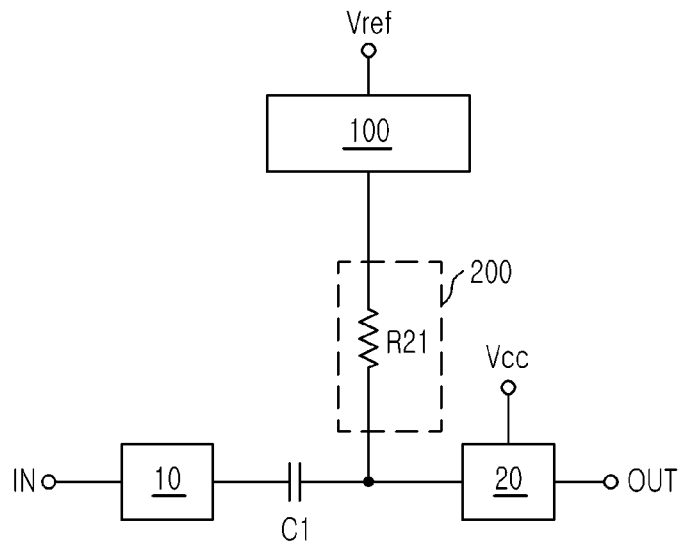
FIG. 6 is an equivalent circuit diagram in which the bypass circuit unit is in an OFF state according to an embodiment of the present invention.

FIG. 5 is an equivalent circuit diagram in which a bypass circuit unit is in an ON state according to an embodiment of the present invention, and FIG. 6 is an equivalent circuit diagram in which the bypass circuit unit is in an OFF state according to an embodiment of the present invention.

Referring to FIGS. 5 and 6, the bypass circuit unit 300 may perform a switching operation according to the mode voltage Vmode illustrated in FIGS. 1 and 2.

For example, when the input signal is a large signal equal to or higher than a pre-set reference value, the mode voltage Vmode may include a switching ON level, and thus, the semiconductor switching device Q31 of the bypass circuit unit 300 may be turned on. In this case, the bypass circuit unit 300 shown in FIGS. 1 and 2 may be equivalently expressed as illustrated in FIG. 5. Here, the semiconductor switching device Q31 illustrated in FIGS. 1 and 2 may be equivalently represented as a resistor RQ31.

Meanwhile, when the input signal is a small signal lower than the pre-set reference value, the mode voltage Vmode may include a switching OFF level, and thus, the semiconductor switching device Q31 of the bypass circuit unit 300 may be turned off. In this case, the bypass circuit unit 300 may be equivalently expressed such that it is as good as absent as illustrated in FIG. 6.

As described above, the bypass circuit unit 300 performs a switching operation according to the mode voltage Vmode based on a magnitude of the input signal, and accordingly, the bias voltage may be changed.

According to the mode voltage Vmode, when a large input signal is applied, the semiconductor switching device Q31 of the bypass circuit unit 300 is turned on, and when a small input signal is applied, the semiconductor switching device Q31 of the bypass circuit unit 300 is turned off.

Figure 7:
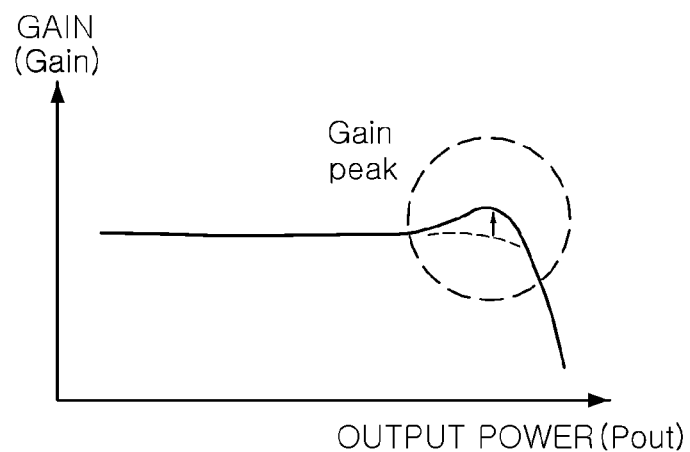
FIG. 7 is a graph showing an effect of the bypass circuit unit according to an embodiment of the present invention.

FIG. 7 is a graph showing an effect of the bypass circuit unit according to an embodiment of the present invention.

Referring to the graph of FIG. 7, when a large input signal is applied, the semiconductor switching device Q31 of the bypass circuit unit 300 is turned on by the mode voltage Vmode, and at this time, the input signal is added to the base voltage through the bypass circuit unit 300, increasing the base voltage, and as a result, the reduced gain is compensated to increase linearity.

Meanwhile, when a small input signal is applied, the semiconductor switching device Q31 of the bypass circuit unit 300 is turned off by the mode voltage Vmode, and at this time, the bypass circuit unit 300 is as good as absent, so the base voltage is not increased, and thus, a degradation of linearity may be restrained.

Figure 8:
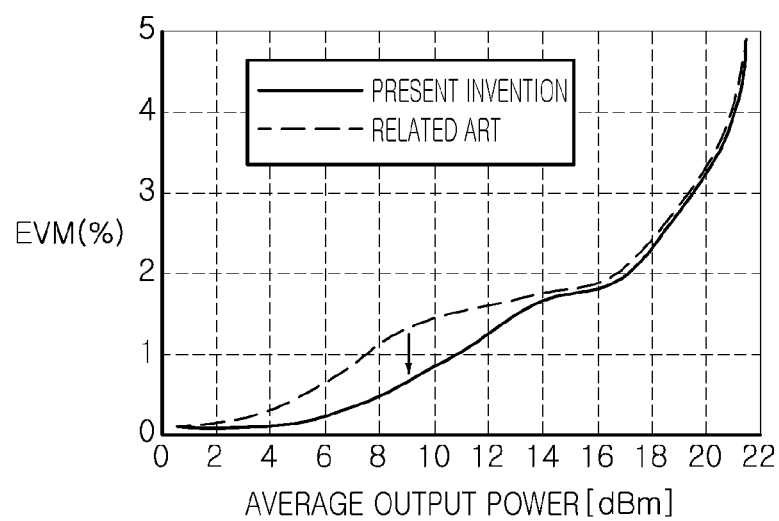
FIG. 8 is a graph showing EVM-average output power characteristics of the power amplifier according to an embodiment of the present invention.

FIG. 8 is a graph showing error vector magnitude (EVM)-average output power characteristics of the power amplifier according to an embodiment of the present invention.

Referring to FIG. 8, in the power amplifier according to the embodiment of the present invention, since the bypass circuit unit 300 operates differentially according to a magnitude of an input signal, it may be easily optimized.

Meanwhile, linearity of the linear power amplifier may be evaluated by EVM (%) characteristics, and the EVM (%) may be better as it is reduced. Referring to FIG. 8, it can be seen that the EVM characteristics were improved on the whole, and in particular, the EVM characteristics of the power amplifier according to an embodiment of the present invention were further improved at relatively low power (14 dB or below) in comparison to existing power amplifier.

As set forth above, according to embodiments of the invention, the power amplifier is applicable to a wireless communications system, and since the power amplifier operates differently according to a large signal and a small signal based on a pre-set reference value, a degradation of linearity and error vector magnitude (EVM) characteristics can be improved.

While the present invention has been shown and described in connection with the embodiments, it will be apparent to those skilled in the art that modifications and variations can be made without departing from the spirit and scope of the invention as defined by the appended claims.

What is claimed is:

1. A power amplifier comprising:
   a bias circuit unit generating a bias voltage of an amplifying unit;
   a voltage drop unit disposed between the bias circuit unit and the amplifying unit to drop the bias voltage to a base voltage; and
   a bypass circuit unit including an impedance element connected to the voltage drop unit in parallel and performing a switching operation according to a magnitude of an input signal,
   wherein the bypass circuit unit includes:
   a capacitor having one end connected to the supply node of the bias voltage supplied by the bias circuit unit and the other end; and
   a semiconductor switching device having one end connected to the other end of the capacitor and the other end connected to the input node of the amplifying unit through a signal coupling capacitor, and performing a switching operation according to the magnitude of the input signal.

2. The power amplifier of claim 1, wherein when the input signal is equal to or higher than a pre-set reference value, the bypass circuit unit is switched on, and when the input signal is lower than the pre-set reference value, the bypass circuit unit is switched off.

3. The power amplifier of claim 1, wherein the voltage drop unit includes a resistor having one end connected to a supply node of the bias voltage supplied by the bias circuit unit and the other end connected to an input node of the amplifying unit.

4. The power amplifier of claim 1, wherein the semiconductor switching device performs a switching operation according to a mode voltage having a switching ON level or a switching OFF level according to the magnitude of the input signal.

5. The power amplifier of claim 1, wherein the bias circuit unit includes:
   a regulated voltage generation unit generating a regulated voltage by using a pre-set reference voltage; and
   a bias voltage generation unit generating the bias voltage according to the regulated voltage.

6. The power amplifier of claim 1, wherein the regulated voltage generation unit generates the regulated voltage by dividing the reference voltage and performing temperature compensation.

7. The power amplifier of claim 1, wherein the regulated voltage generation unit includes:
   a first temperature compensating transistor having a collector connected to a supply terminal of a pre-set reference voltage through a first resistor, an emitter connected to a ground, and a base; and
   a second temperature compensating transistor having a collector connected to the supply terminal of the reference voltage, a base connected to the collector of the first temperature compensating transistor, and an emitter connected to the ground through a second resistor.

8. The power amplifier of claim 7, wherein the bias voltage generation unit includes a bias supplying transistor having a collector connected to the supply terminal of the reference voltage, a base connected to the collector of the first temperature compensating transistor, and an emitter connected to the supply node of the bias voltage supplied by the bias circuit unit.

9. A power amplifier comprising:
   a bias circuit unit generating a bias voltage of an amplifying unit;
   a voltage drop unit disposed between the bias circuit unit and the amplifying unit to drop the bias voltage to a base voltage;
   a bypass circuit unit including an impedance element connected to the voltage drop unit in parallel and performing a switching operation according to controlling based on a magnitude of an input signal; and
   a bypass control unit controlling a switching operation of the bypass circuit unit according to the magnitude of the input signal,
   wherein the bypass circuit unit includes:
   a capacitor having one end connected to the supply node of the bias voltage supplied by the bias circuit unit and the other end; and a semiconductor switching device having one end connected to the other end of the capacitor and the other end connected to the input node of the amplifying unit through a signal coupling capacitor, and performing a switching operation according to the magnitude of the input signal.

10. The power amplifier of claim 9, wherein when the input signal is equal to or higher than a pre-set reference value, the bypass control unit controls the bypass circuit unit to be switched on, and when the input signal is lower than the pre-set reference value, the bypass control unit controls the bypass circuit unit to be switched off.

11. The power amplifier of claim 10, wherein when the input signal is equal to or higher than a pre-set reference value, the bypass circuit unit is switched on, and when the input signal is lower than the pre-set reference value, the bypass circuit unit is switched off, under the control of the bypass control unit.

12. The power amplifier of claim 9, wherein the voltage drop unit includes a resistor having one end connected to a supply node of the bias voltage supplied by the bias circuit unit and the other end connected to an input node of the amplifying unit.

13. The power amplifier of claim 9, wherein when the input signal is equal to or higher than the pre-set reference value, the bypass control unit provides a mode voltage having a switching ON level to the semiconductor switching device, and when the input signal is lower than the pre-set reference value, the bypass control unit provides a mode voltage having a switching OFF level to the semiconductor switching device.

14. The power amplifier of claim 9, wherein the bias circuit unit includes:
   a regulated voltage generation unit generating a regulated voltage by using a pre-set reference voltage; and
   a bias voltage generation unit generating a bias voltage according to the regulated voltage.

15. The power amplifier of claim 9, wherein the regulated voltage generation unit generates the regulated voltage by dividing the reference voltage and performing temperature compensation.

16. The power amplifier of claim 9, wherein the regulated voltage generation unit includes:
   a first temperature compensating transistor having a collector connected to a supply terminal of a pre-set reference voltage through a first resistor, an emitter connected to a ground, and a base; and
   a second temperature compensating transistor having a collector connected to the supply terminal of the reference voltage, a base connected to the collector of the first temperature compensating transistor, and an emitter connected to the ground through a second resistor.

17. The power amplifier of claim 16, wherein the bias voltage generation unit includes a bias supplying transistor having a collector connected to the supply terminal of the reference voltage, a base connected to the collector of the first temperature compensating transistor, and an emitter connected to the supply node of the bias voltage supplied by the bias circuit unit.

* * * * *